(12) United States Patent
Choi et al.

(10) Patent No.: US 10,172,238 B2
(45) Date of Patent: Jan. 1, 2019

(54) MULTILAYER CAPACITOR AND BOARD HAVING THE SAME

(71) Applicant: SAMSUNG ELECTRO-MECHANICS CO., LTD., Suwon-si, Gyeonggi-do (KR)

(72) Inventors: Ho Sam Choi, Suwon-si (KR); Ki Pyo Hong, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 27 days.

(21) Appl. No.: 15/492,447

(22) Filed: Apr. 20, 2017

(65) Prior Publication Data

US 2018/0027658 A1   Jan. 25, 2018

(30) Foreign Application Priority Data

Jul. 21, 2016   (KR) .......................... 10-2016-0092759

(51) Int. Cl.
*H01G 4/012* (2006.01)
*H01G 4/232* (2006.01)
*H01G 4/30* (2006.01)
*H05K 1/18* (2006.01)
(Continued)

(52) U.S. Cl.
CPC ............. *H05K 1/181* (2013.01); *H01G 4/012* (2013.01); *H01G 4/232* (2013.01); *H01G 4/30* (2013.01); *H05K 1/111* (2013.01); *H05K 3/3431* (2013.01); *H05K 2201/10015* (2013.01)

(58) Field of Classification Search
CPC ............. H01G 2/06; H01G 2/106; H01G 4/12; H01G 4/012; H01G 4/224; H01G 4/228; H01G 4/232; H01G 4/30; H05K 1/11; H05K 1/18; H05K 1/111; H05K 1/181; H05K 1/183; H05K 3/30; H05K 3/325; (Continued)

(56) References Cited

U.S. PATENT DOCUMENTS 6,576,497 B2 * 6/2003 Ahiko .................... H01G 4/012
                                                          257/700
2013/0050899 A1   2/2013 Kim et al.
(Continued)

FOREIGN PATENT DOCUMENTS

JP       2014187216 A  * 10/2014  ............... H01G 4/12
KR   10-2007-0075867 A    7/2007
KR   10-2013-0022824 A    3/2013

*Primary Examiner* — Timothy Thompson
*Assistant Examiner* — Guillermo Egoavil
(74) *Attorney, Agent, or Firm* — McDermott Will & Emery LLP

(57) ABSTRACT

A multilayer capacitor includes a capacitor body including first and second internal electrodes alternately stacked with dielectric layers interposed therebetween. The first and second internal electrodes are exposed at a mounting surface of the capacitor body. The capacitor body includes first and second groove parts at the mounting surface, spaced apart in a length direction of the capacitor body, and contacting exposed portions of the first and second internal electrodes, respectively. The multilayer capacitor includes first and second external electrodes in the first and second groove parts, respectively, and electrically connected to the exposed portions of the first and second internal electrodes, respectively.

25 Claims, 7 Drawing Sheets

(51) Int. Cl.
*H05K 1/11* (2006.01)
*H05K 3/34* (2006.01)
(58) Field of Classification Search
CPC ....... H05K 3/3431; H05K 2201/09381; H05K 2201/10015; H05K 2201/10636
USPC .......................................... 174/260; 438/122
See application file for complete search history.

(56) References Cited

U.S. PATENT DOCUMENTS

| | | | | |
|---|---|---|---|---|
| 2014/0138138 A1* | 5/2014 | Park | ....................... | H05K 1/183 174/260 |
| 2015/0243438 A1* | 8/2015 | Ahn | ....................... | H01G 4/012 174/258 |
| 2015/0318113 A1* | 11/2015 | Kim | ....................... | H01G 4/232 174/260 |

* cited by examiner

MULTILAYER CAPACITOR AND BOARD HAVING THE SAME

CROSS-REFERENCE TO RELATED APPLICATION(S)

This application claims benefit of priority to Korean Patent Application No. 10-2016-0092759, filed on Jul. 21, 2016 in the Korean Intellectual Property Office, the disclosure of which is incorporated herein by reference in its entirety.

BACKGROUND

1. Field

The present disclosure relates to a multilayer capacitor and a board having the same.

2. Description of Related Art

A multilayer capacitor, one of a variety of multilayer electronic components, is mounted on a circuit board of several electronic products, such as an image device, a liquid crystal display (LCD), a plasma display panel (PDP), a computer, a personal digital assistant (PDA), a cellular phone, and the like, to serve to charge or discharge electricity therein or therefrom.

A multilayer capacitor may be used as a component of various electronic devices, due to advantages such as a small size, high capacitance, and ease of mounting.

In order to implement a high capacitance multilayer capacitor, the permittivity the capacitor body may be increased or the dielectric layers and internal electrodes can be thinned to allowed for an increased number.

However, it may be difficult to develop a composition of high-permittivity material and there may be limitations in decreasing the thickness of the dielectric layer. Consequently, the current approaches are limited in their ability to increase capacitance.

Therefore, research into a method capable of increasing capacitance of the product, while satisfying the trend toward miniaturization of the capacitor, has been required.

In a 2-terminal multilayer capacitor according to the related art, external electrodes are formed on both end portions of a capacitor body in a length direction. This increases the size of the 2-terminal multilayer capacitor in the length direction, corresponding to the application areas of the external electrodes.

In a multilayer capacitor having a structure where a lower surface of the capacitor body is the mounting surface (hereinafter, referred to as a lower surface mounting structure), which is a surface mounting device (SMD), external electrodes are formed on the mounting surface of the capacitor body.

Therefore, application areas of the external electrodes may be decreased and areas of internal electrodes may thus be increased, corresponding to a decrease in the application areas of the external electrodes, to thereby increase the capacitance of the capacitor.

However, having the external electrodes only on the mounting surface of the capacitor body decreases the mounting area of the multilayer capacitor contacting solder, which may decrease solder adhesion strength.

In order to secure solder adhesion strength with a lower surface mounting structure, a structure in which the external electrodes are extended to portions of side surfaces of the capacitor body has been disclosed. But this increases the mounting area where the solder fillet is formed in the length direction of the capacitor body, in accordance with a size of the extended external electrodes.

Therefore, the original aim and effect of increasing areas of internal electrodes by decreasing application areas of the external electrodes may not be effectively achieved.

SUMMARY

An aspect of the present disclosure may provide a multilayer capacitor capable of improving adhesion strength with solder at the time of mounting the multilayer capacitor on a circuit board in a lower surface mounting structure, and a board having the same.

According to an aspect of the present disclosure, a multilayer capacitor may include: a capacitor body with first and second internal electrodes alternately stacked with dielectric layers interposed therebetween. The internal electrodes are exposed at a mounting surface of the capacitor body. The capacitor body includes first and second groove parts at the mounting surface, spaced apart in a length direction of the capacitor body, and contacting exposed portions of the first and second internal electrodes, respectively. The multilayer capacitor may include first and second external electrodes in the first and second groove parts, respectively, and electrically connected to the exposed portions of the first and second internal electrodes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Directions of a capacitor body will be defined in order to clearly describe exemplary embodiments in the present disclosure. X, Y, and Z directions illustrated in the accompanying drawings refer to a length direction, a width direction, and a height direction, respectively. The width direction may be the same as a stacking direction in which dielectric layers and internal electrodes are stacked. The length direction may be defined as the direction in which the first and second groove parts are spaced apart from each other.

In the exemplary embodiments, for convenience of explanation, both surfaces of a capacitor body 110 opposing each other in the Z direction will be defined as first and second surfaces S1 and S2, both surfaces of the capacitor body 110 opposing each other in the X direction and connecting ends of the first and second surfaces S1 and S2 to each other will be defined as third and fourth surfaces S3 and S4, and both surfaces of the capacitor body 110 opposing each other in the Y direction and connecting ends of the first and second surfaces S1 and S2 to each other and connecting the third and fourth surfaces S3 and S4 to each other, respectively, will be defined as fifth and sixth surfaces S5 and S6. The first surface S1 may be the mounting surface.

Multilayer Capacitor

Figure 1:
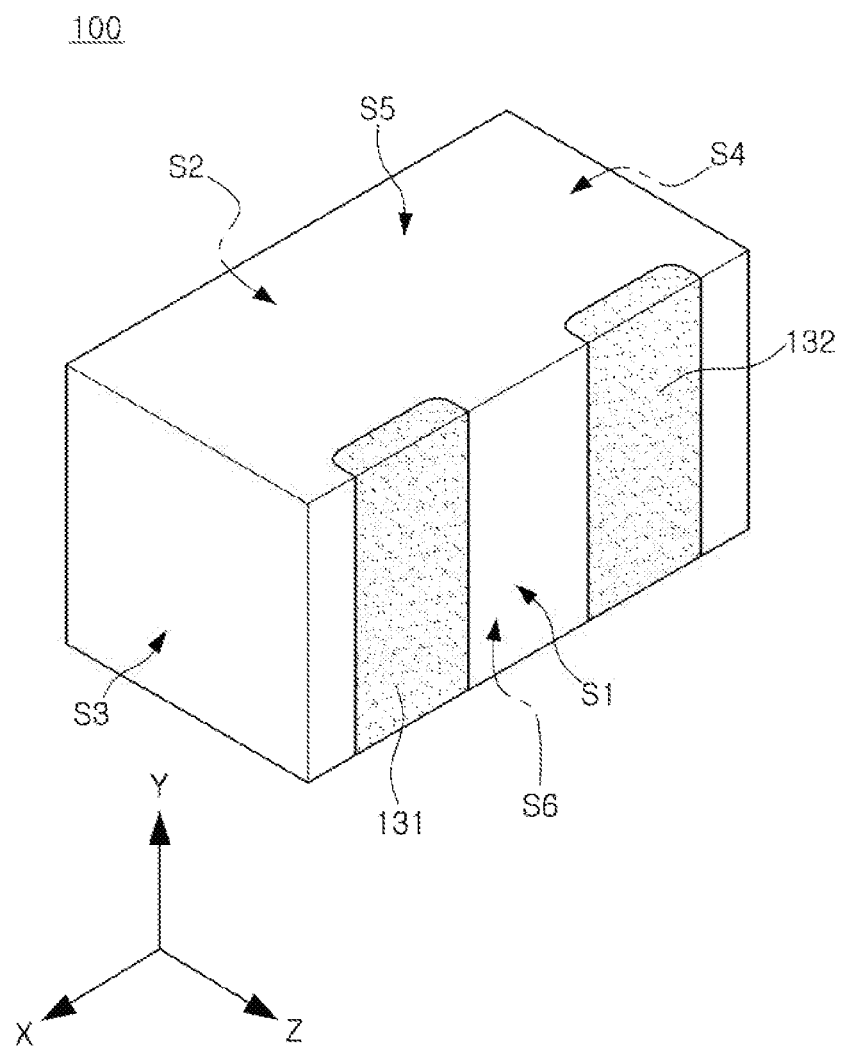
FIG. 1 is a perspective view schematically illustrating a multilayer capacitor according to an exemplary embodiment in the present disclosure.
Figure 2A:
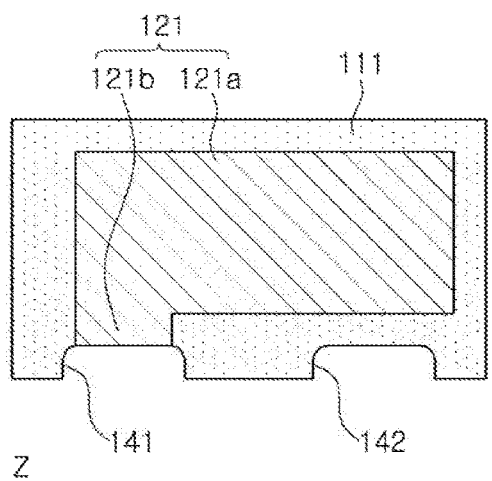
FIGS. 2A and 2B are plan views illustrating structures of dielectric layers and first and second internal electrodes applied to the multilayer capacitor of FIG. 1, respectively.
Figure 2B:
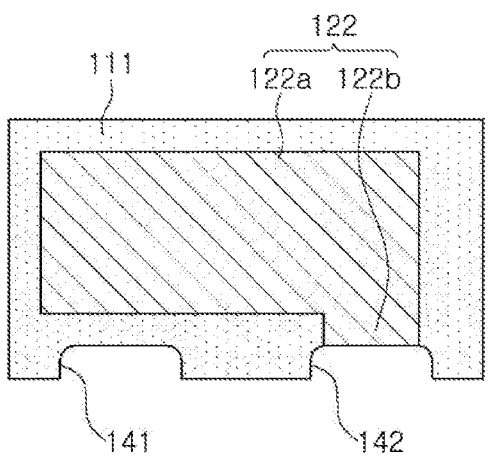

FIG. 1 is a perspective view schematically illustrating a multilayer capacitor according to an exemplary embodiment in the present disclosure. FIGS. 2A and 2B are plan views illustrating structures of first and second internal electrodes applied to the multilayer capacitor of FIG. 1, respectively.

Referring to FIGS. 1 and 2, a multilayer capacitor 100 according to the present exemplary embodiment may include a capacitor body 110 and first and second external electrodes 131 and 132. The capacitor body 110 may include dielectric layers 111, first and second internal electrodes 121 and 122, and first and second groove parts 141 and 142.

The capacitor body 110 may be formed by stacking a plurality of dielectric layers 111. The capacitor body 110 may have a substantially hexahedral shape as illustrated in FIG. 1, but is not particularly limited thereto.

The shape and dimensions of the capacitor body 110 and the number of stacked dielectric layers 111 are not limited to those illustrated in the accompanying drawings.

The dielectric layers 111 may be in a sintered state, and adjacent dielectric layers 111 may be integrated with each other so that boundaries therebetween are not readily apparent without a scanning electron microscope (SEM).

The capacitor body 110 as described above may include an active region, including the first and second internal electrodes 121 and 122 contributing to forming capacitance of the capacitor, and cover regions disposed on outermost portions of the active region opposing each other, respectively, as margin parts.

The active region may be formed by repeatedly stacking a plurality of first and second internal electrodes 121 and 122 with dielectric layers 111 interposed therebetween.

The thickness of the dielectric layer 111 may be selected depending on a capacitance design of the multilayer capacitor 100.

The dielectric layer 111 may contain ceramic powders having high permittivity, for example, barium titanate (BaTiO$_3$) based powders or strontium titanate (SrTiO$_3$) based powders. However, the material of the dielectric layer 111 is not limited thereto.

The dielectric layer 111 may further contain at least one of ceramic additives, organic solvents, plasticizers, binders, dispersants, and the like, if necessary, in addition to the ceramic powders.

The cover regions may be formed of the same material as that of the dielectric layers 111 and have the same configuration as that of the dielectric layer 111, other than being positioned at both sides of the capacitor body 110 in the Y direction and lacking internal electrodes.

The cover regions as described above may be prepared by stacking one or more dielectric layers 111 in both outer sides of the active region in the Y direction, respectively, and may serve to prevent the first and second internal electrodes 121 and 122 from being damaged by physical or chemical stress.

The first and second internal electrodes 121 and 122 may be electrodes having different polarities from each other.

The first and second internal electrodes 121 and 122 may be alternately stacked in the capacitor body 110 with dielectric layers 111 interposed therebetween in the Y direction. The first and second internal electrodes 121 and 122 may be formed by printing a conductive paste containing a conductive metal on the dielectric layer 111 at a predetermined thickness, and may be electrically insulated from each other by the dielectric layer 111 interposed therebetween.

The conductive metal contained in the conductive paste may be, for example, nickel (Ni), copper (Cu), palladium (Pd), or an alloy thereof, but is not limited thereto.

The conductive paste may be printed by a screen printing method, a gravure printing method, or the like, but is not limited thereto.

The first and second internal electrodes 121 and 122 according to the present exemplary embodiment may be formed to be exposed at the first surface S1 of the capacitor body 110.

The exposed portions of the first and second internal electrodes 121 and 122 may be disposed to be spaced apart from each other in the X direction.

The overlapping area between the first and second internal electrodes 121 and 122 in the Y direction may be associated with capacitance of the capacitor.

The first internal electrode 121 may include a first body portion 121a and a first lead portion 121b that extends from the first body portion 121a to be exposed at the first surface S1 of the capacitor body 110.

The second internal electrode 122 may include a second body portion 122a overlapping the first body portion 121a in the Y direction and a second lead portion 122b that extends from the second body portion 122a to be exposed at the first surface S1 of the capacitor body 110. The first and second lead portions 121b and 122b may be spaced apart from each other in the X direction.

The first groove part 141 may be formed in the first surface S1 of the capacitor body 110 to be elongated in the Y direction.

The first groove part 141 may be formed so that both ends thereof are exposed at the fifth and sixth surfaces S5 and S6 of the capacitor body 110.

The first groove part 141 may be formed so that an end of the first lead portion 121b of the first internal electrode 121 is removed together.

The second groove part 142 may be formed in the first surface S1 of the capacitor body 110 to be elongated in the Y direction.

The second groove part 142 may be formed so that both ends thereof are exposed at the fifth and sixth surfaces S5 and S6 of the capacitor body 110, and an end of the second lead portion 122b of the second internal electrode 122 is removed together.

The first external electrode 131 may be formed by filling the first groove part 141 with a conductive material.

The first external electrode 141 may contact the end of the first lead portion 121b of the first internal electrode 121 corresponding to the first groove part 141 to electrically connect the plurality of first internal electrodes 121 stacked in the Y direction to each other.

Both ends of the first external electrode 131 in the Y direction may be exposed at the fifth and sixth surfaces S5 and S6 of the capacitor body 110.

The second external electrode 132 may be formed by filling the second groove part 142 with a conductive material.

The second external electrode 132 may contact the end of the second lead portion 122b of the second internal electrode 122 corresponding to the second groove part 142 to electrically connect the plurality of second internal electrodes 122 stacked in the Y direction to each other.

Both ends of the second external electrode 132 in the Y direction may be exposed at the fifth and sixth surfaces S5 and S6 of the capacitor body 110.

The first and second external electrodes 131 and 132 as described above may be formed of a conductive paste including a conductive metal.

The conductive metal may be, for example, nickel (Ni), copper (Cu), palladium (Pd), gold (Au), or an alloy thereof, but is not limited thereto.

The first and second external electrodes 131 and 132 may be formed so that surfaces thereof are coplanar with the first surface S1 of the capacitor body 110, which can be the mounting surface of the capacitor body 110. Therefore, at the time of installing the multilayer capacitor on a circuit board, the height of the multilayer capacitor on the board may be decreased.

Figure 3:
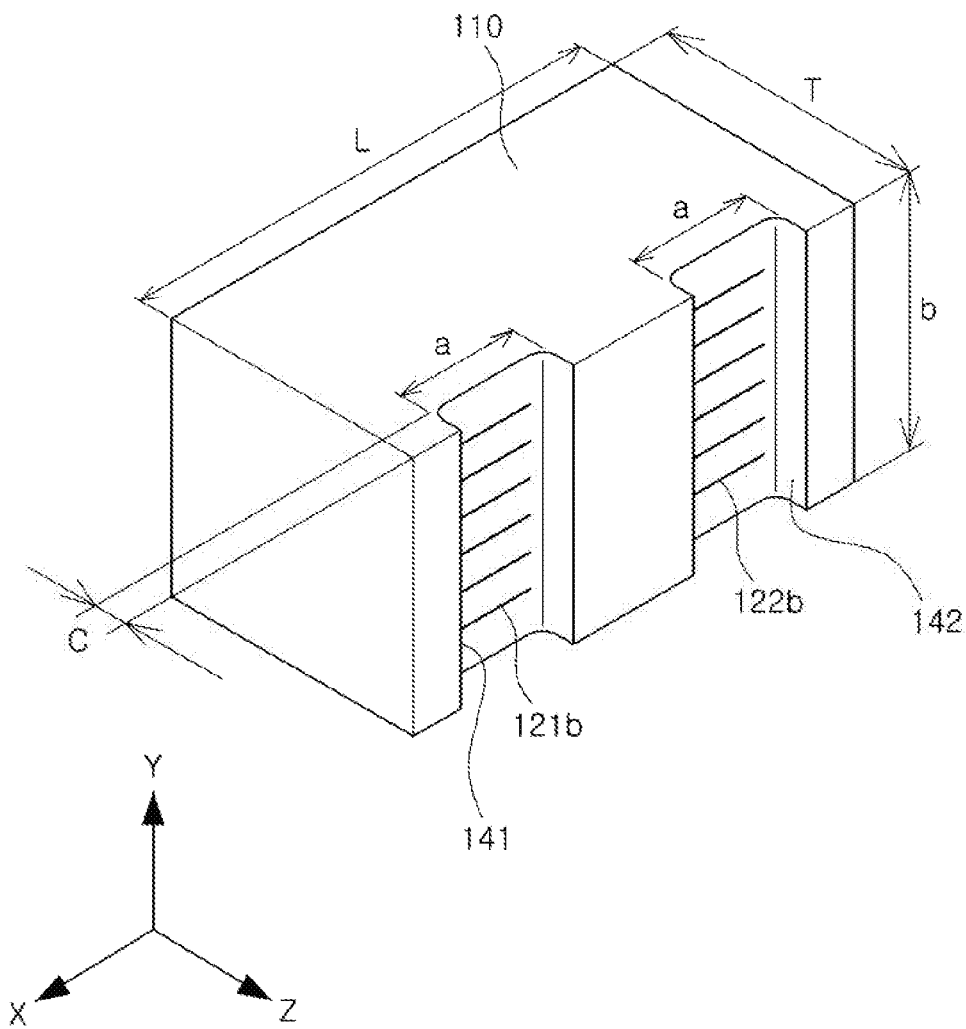
FIG. 3 is a perspective view illustrating a capacitor body of FIG. 1 in a state in which the first and second external electrodes are omitted.

Referring to FIG. 3, dimension "a" is a width of each of the first and second groove parts 141 and 142 in the X direction, dimension "b" is a width of the capacitor body 110 in the Y direction, dimension "c" is a depth of each of the first and second groove parts 141 and 142 in the Z direction, dimension "L" is a length of the capacitor body 110, and dimension "T" is a height of the capacitor body 110.

When a is ⅙ L or less, capacitance may not be sufficiently secured due to deterioration of connectivity, and when a is ⅓ L or more, strength of the capacitor may be deteriorated. Therefore, it is preferable that a satisfies ⅙ L<a<⅓ L.

Further, when c is ⅙ T or more, a short-circuit may occur where an external electrode contacts an internal electrode with a different polarity. Therefore, it is preferable that c satisfies c<⅙ T.

Although the cross-sectional shape of the first and second groove parts 141 and 142 is illustrated and described as a substantially quadrangle in the present exemplary embodiment, the cross-sectional shape is not limited thereto.

Figure 4:
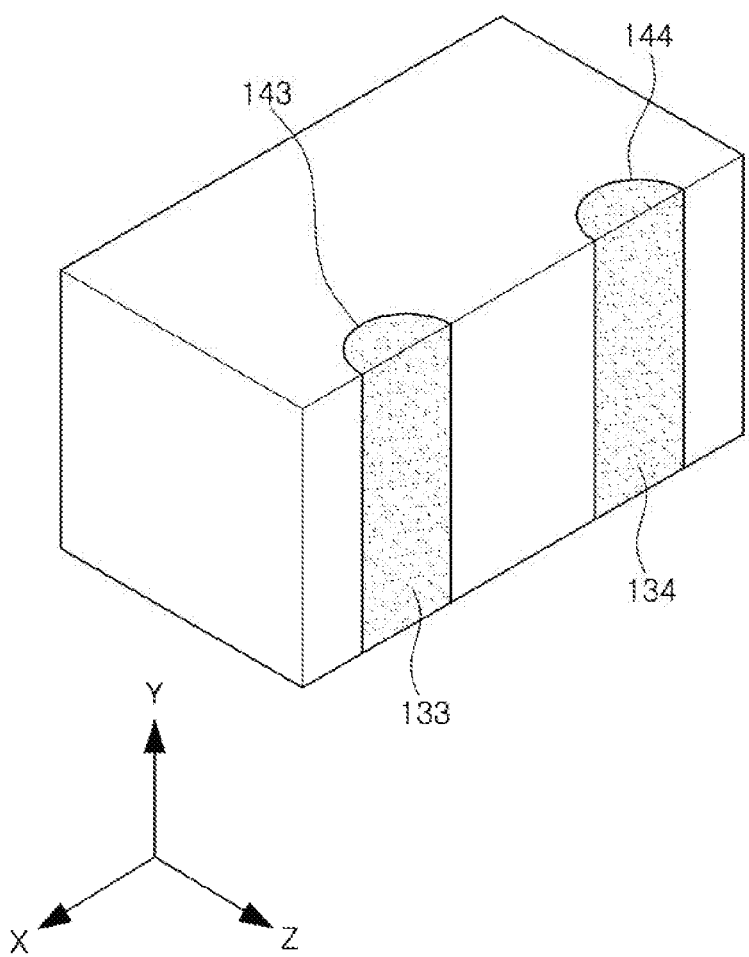
FIG. 4 is an exploded perspective view illustrating another example of groove parts and external electrodes in the multilayer capacitor of FIG. 1.

For example, as illustrated in FIG. 4, across-sectional shape of first and second groove parts 143 and 144 may be an arc with an approximately semi-circular shape. The first and second groove parts may have various cross-sectional shapes, for example, a circle, a triangle, and the like.

The shape of the first and second external electrodes 133 and 134 may also be selected depending on the shape of the first and second groove parts 143 and 144.

According to the present disclosure, the shapes of the first and second external electrodes 133 and 134 may be an arc with an approximately semi-circular shape corresponding to the shape of the first and second groove parts 143 and 144.

The multilayer capacitor according to the present exemplary embodiment may have a lower surface mounting structure. The distance between the first and second external electrodes 131 and 132 may be short, and the distance between the first and second internal electrodes 121 and 122 applied with external polarities may be short. As such, when applying a voltage, the current loop is decreased, and equivalent series inductance (ESL) may be further decreased.

In a 2-terminal multilayer capacitor according to the related art, external electrodes are formed by loading a capacitor body on a carrier plate and dipping both end portions of the capacitor body in a conductive paste.

In the method of forming the external electrodes as described above, the size of the capacitor can be increased corresponding to the thickness of the external electrodes that would be formed on both end portions of the capacitor body in the related art.

When the external electrodes are sintered, the manufacturing process may be complicated.

In contrast, in a capacitor having the lower surface mounting structure, the external electrodes may be formed using an engraved or embossed jig.

Soldering may be performed only on the external electrodes protruding outwardly from the mounting surface of the capacitor body.

The area of the portion in which capacitance is formed may be further secured as the 2-terminal multilayer capacitor. However, since the contact area of the solder may be further decreased, adhesion strength between the capacitor and the circuit board may be decreased.

In the multilayer capacitor according to the present exemplary embodiment, after the first and second groove parts are formed in the mounting surface of the capacitor body and the first and second external electrodes are formed in the first and second groove parts by a coating method, the capacitor body and the external electrodes may be simultaneously sintered.

Therefore, the manufacturing process may be simplified, and the multilayer capacitor may have a lower surface mounting structure in which the first and second external electrodes are formed on the mounting surface of the capacitor body, but not protruding outwardly from the mounting surface of the capacitor body.

Since areas of exposed portions of the first and second external electrodes may be significantly increased in a range in which the first and second lead portions are not connected to each other, a contact area with solder may be increased, such that adhesion strength between the capacitor and the circuit board may be improved.

Modified Exemplary Embodiment

Figure 5:
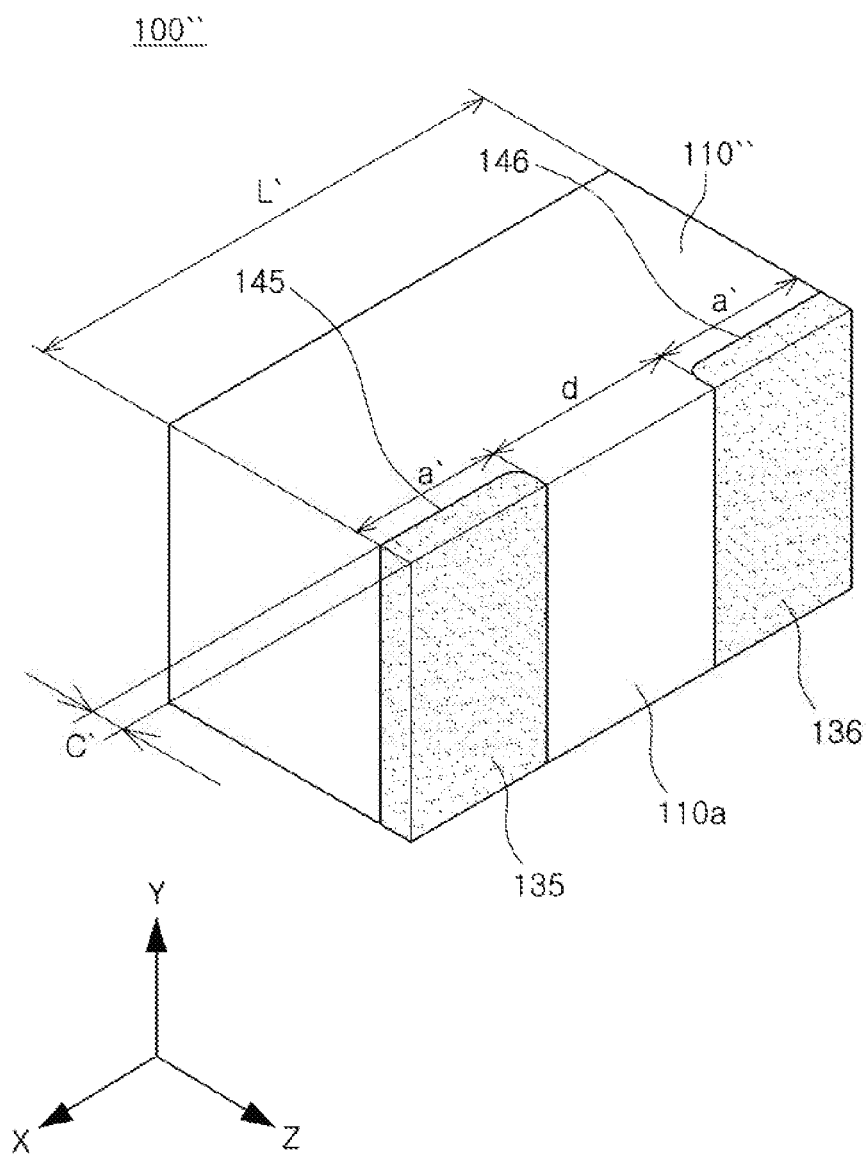
FIG. 5 is a perspective view illustrating another example of groove parts and external electrodes in the multilayer capacitor of FIG. 1.

FIG. 5 is a perspective view illustrating another example of groove parts and external electrodes in the multilayer capacitor of FIG. 1.

The structures of dielectric layers 111 and first and second internal electrodes 121 and 122 are similar to those in the exemplary embodiment described above, thus an overlapping description thereof will be omitted.

Referring to FIG. 5, in a multilayer capacitor 100" according to the present exemplary embodiment, first and second groove parts 145 and 146 formed in a first surface of a capacitor body 110" may each be extended away from each other in the X direction to reach the third and fourth surfaces of the capacitor body 110".

That is, the corners of the capacitor body 110" at the first surface of the capacitor body 110" may be at least partially removed for the first and second groove parts.

Figure 6:
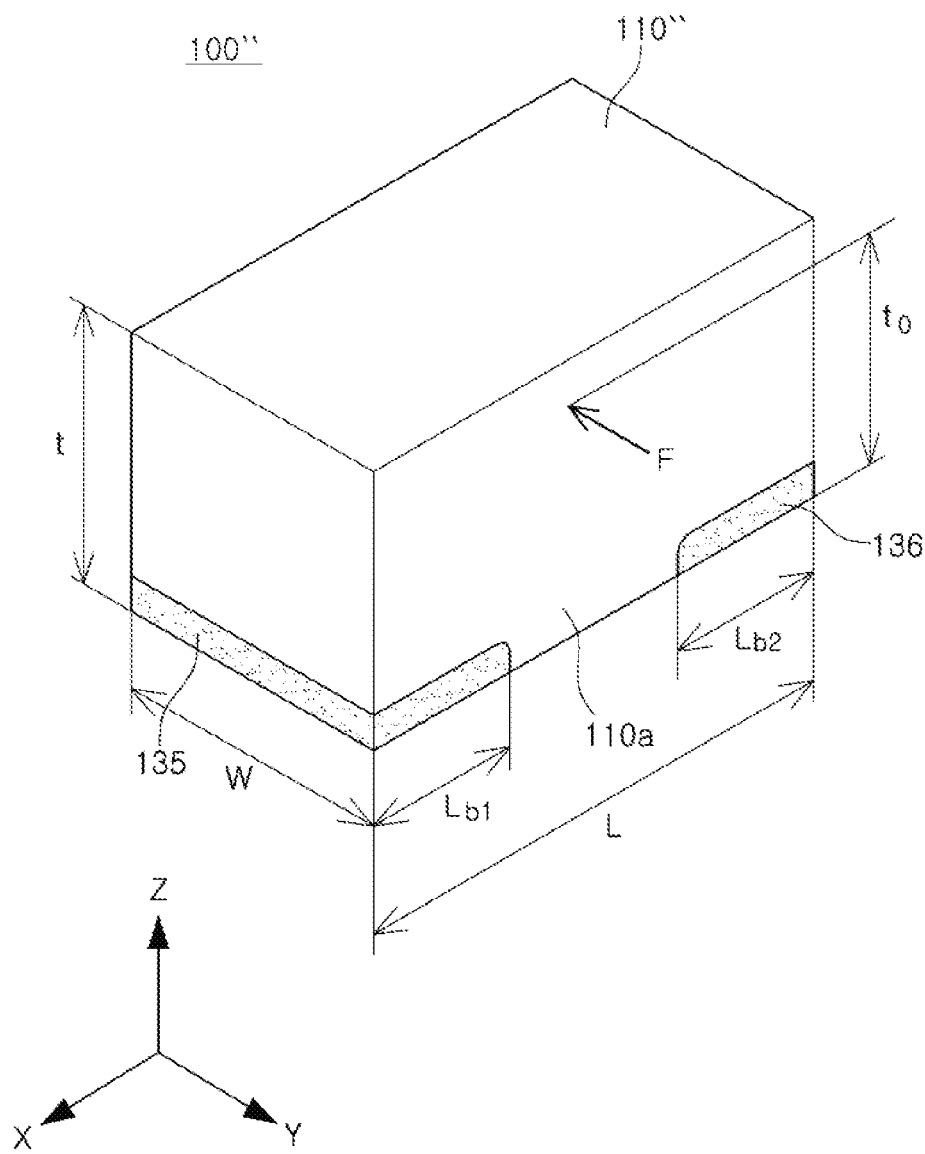
FIG. 6 is a perspective view illustrating the multilayer capacitor of FIG. 5 in a state rotated by 90°.
Figure 7:
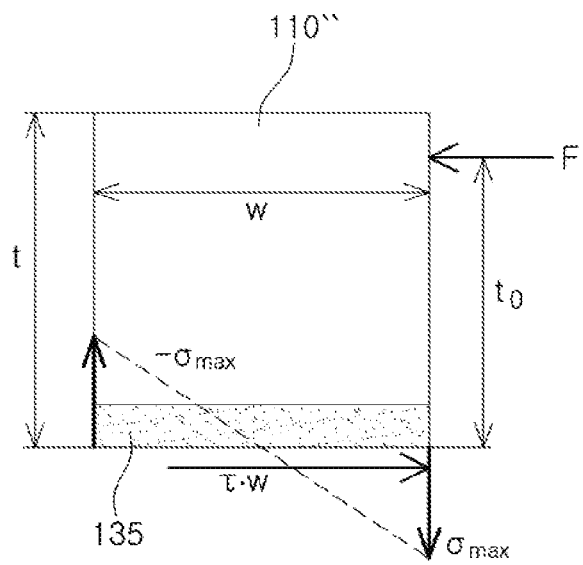
FIG. 7 is a side view of FIG. 6.

FIG. 6 is a perspective view illustrating the multilayer capacitor of FIG. 5 in a state rotated by 90°. FIG. 7 is a side view of FIG. 6.

In FIGS. 6 and 7, dimension "t" is a height of the capacitor body, dimension "W" is a width of the capacitor body, and dimension "L" is a length of the capacitor body. Dimension "Lb1" is a width of a first external electrode, and dimension "Lb2" is a width of the second external electrode. "F" is force applied to the capacitor body, and dimension "t0" is a height of a position to which force is applied to the side of the capacitor body.

The correlation between the areas of the first and second external electrodes and solder adhesion strength may be represented by the following Equations 1 and 2. Here, Lb=Lb1+Lb2, σ is tensile stress of each of the first and second external electrodes, and τ is shearing stress of each of the first and second external electrodes.

Equation 1 relates to Force Equilibrium, and Equation 2 relates to Moment Equilibrium.

$$F = \tau \cdot w \cdot L_b \quad \text{[Equation 1]}$$

$$F \cdot t_0 = L_b \cdot \int_0^w \sigma_{max} \cdot \left(\frac{2x}{w} - 1\right) \cdot x dx \quad \text{[Equation 2]}$$

$$= \frac{w^2}{6} \sigma_{max} \cdot L_b$$

$$\therefore \sigma_{max} = \frac{6F \cdot t_0}{w^2 L_b}, \tau = \frac{F}{w \cdot L_b}$$

$$\therefore \sigma_{eq} = \sqrt{\frac{\sigma_{max}^2}{2} + 3\tau^2} = \frac{\sqrt{3} F}{w L_b} \sqrt{1 + 6\frac{t_0^2}{w^2}}$$

Referring to FIGS. 1 and 2, when the multilayer capacitor is mounted on a circuit board and applied with a predetermined force F, in order not to be affected by the force, the multilayer capacitor needs to have resistance against the force F.

The force F is calculated in proportion to the area (W×Lb) and shearing stress (τ) of the first and second external electrodes, which are connection parts.

When the force F is increased, in order to endure the increased force F, the areas and shearing stress of the first and second external electrodes need to be increased.

When the capacitor is applied with force F, there may be tensile stress in a vertical direction, in addition to shearing stress in a horizontal direction. Tensile strength is in proportion to the force and is in inverse proportion to the areas of the first and second external electrodes.

Since tensile stress and external force are decreased when the areas of the first and second external electrodes are increased, the influence of the force F in the connection parts may be significantly decreased.

Based on the description for Equations 1 and 2, optimal numerical values of the groove parts of the multilayer capacitor according to the present exemplary embodiment will be described.

In FIG. 5, dimension "d" is a width of a margin portion 110a between the first and second groove parts 145 and 146 in the first surface of the capacitor body 110" in the X direction, dimension "a'" is a width of each of the first and second groove parts in the X direction, dimension "c'" is a depth of each of the first and second groove parts 145 and 146 in a Z direction, and dimension "L'" is a length of the capacitor body 110".

When a' is ⅙ L' or less, the capacitance may not be sufficiently secured due to deterioration of connectivity, and when a' is ⅓ L' or more, the strength of the capacitor may be deteriorated. Therefore, it is preferable that a' satisfies ⅙ L'<a'<⅓ L'.

When d is ⅙ L' or less, the strength of the capacitor may be deteriorated, and when d is ½ L' or more, a' may be relatively decreased, such that the capacitance may not be sufficiently secured due to deterioration of connectivity. Therefore, it is preferable that d satisfies ⅙ L'<d'<½ L'.

Since a maximum margin width of the capacitor body in the Z direction may be changed depending on the size of the capacitor and shapes of the internal electrodes, c' may be set to be equal to or less than the maximum margin width of the capacitor body in the Z direction.

Board Having Multilayer Capacitor

Figure 8:
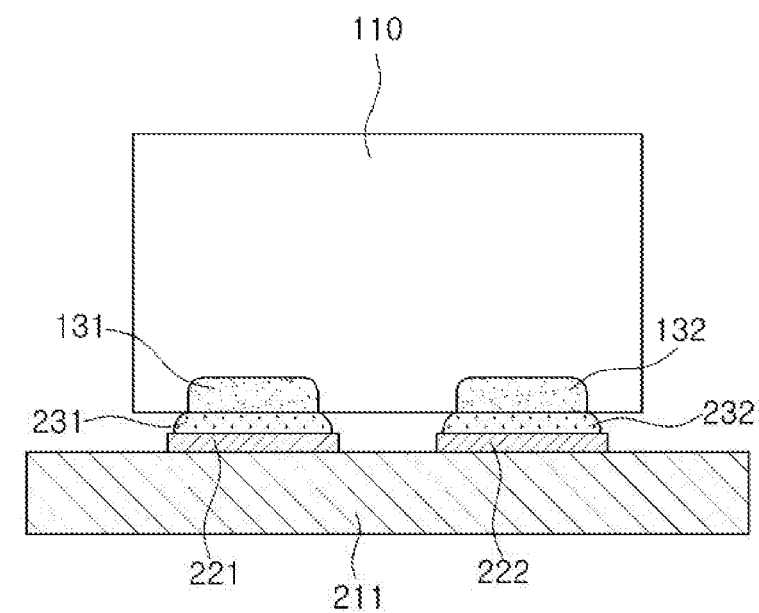
FIG. 8 is a cross-sectional view illustrating a circuit board with the multilayer capacitor of FIG. 1 mounted thereon.

Referring to FIG. 8, a board having a multilayer capacitor according to the present exemplary embodiment may include a circuit board 211 on which the multilayer capacitor 100 is mounted and first and second electrode pads 221 and 222 disposed on an upper surface of the circuit board 211 and spaced apart from each other.

The multilayer capacitor 100 may be fixed and electrically connected to the circuit board 211 by solder 231 and 232, with the first and second external electrodes 131 and 132 positioned to contact the first and second electrode pads 221 and 222, respectively.

Since the first and second external electrodes 121 and 122 of the multilayer capacitor 100 are exposed only to the mounting surface of the capacitor body 110 and formed in the first and second groove parts 141 and 142, the connection area with solder 231 and 232 may be maximally secured at the time of mounting the multilayer capacitor 100 on the circuit board 211.

As set forth above, according to exemplary embodiments in the present disclosure, at the time of mounting the multilayer capacitor on the circuit board, the solder adhesion area may be increased by forming the external electrodes in the groove parts after forming the groove parts in the mounting surface of the capacitor body. Accordingly, the capacitance can be increased for a lower surface mounting structure while avoiding a decrease in solder adhesion strength.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
   a capacitor body with one mounting surface and including first and second internal electrodes alternately stacked, with dielectric layers interposed therebetween, each exposed at the mounting surface, and first and second groove parts at the mounting surface, spaced apart in a length direction of the capacitor body, and contacting exposed portions of the first and second internal electrodes, respectively; and
   first and second external electrodes in the first and second groove parts, respectively, and electrically connected to the exposed portions of the first and second internal electrodes, respectively.

2. The multilayer capacitor of claim 1, wherein the first and second internal electrodes include:
   first and second body portions overlapping each other in a stacking direction of the capacitor body; and
   first and second lead portions that respectively extend from the first and second body portions and are respectively exposed at the first and second groove parts.

3. The multilayer capacitor of claim 1, wherein the mounting surface of the capacitor body and the first and second external electrodes are coplanar.

4. The multilayer capacitor of claim 1, wherein a cross-sectional shape of the first and second groove parts is a quadrangle.

5. The multilayer capacitor of claim 1, wherein a cross-sectional shape of the first and second groove parts is an arc.

6. The multilayer capacitor of claim 1, wherein the groove parts satisfy the relationship $\frac{1}{6}L<a<\frac{1}{3}L$, in which a is a length of each of the first and second groove parts in the length direction, and L is a length of the capacitor body in the length direction.

7. The multilayer capacitor of claim 1, wherein the groove parts satisfy the relationship $c<\frac{1}{6}T$, in which c is a depth of each of the first and second groove parts in a thickness direction from the mounting surface to an opposing surface of the capacitor body, and T is a height of the capacitor body in the thickness direction.

8. A multilayer capacitor comprising:
a capacitor body with one mounting surface and including first and second internal electrodes alternately stacked, with dielectric layers interposed therebetween, each exposed at the mounting surface, and first and second groove parts at the mounting surface, spaced apart in a length direction of the capacitor body, and contacting exposed portions of the first and second internal electrodes, respectively; and
first and second external electrodes in the first and second groove parts, respectively, and electrically connected to the exposed portions of the first and second internal electrodes, respectively,
wherein the first and second groove parts extend away from each other in the length direction to opposing sides of the mounting surface.

9. The multilayer capacitor of claim 8, wherein the groove parts satisfy the relationship $\frac{1}{6}L'<a'<\frac{1}{3}L'$, in which a' is a length of each of the first and second groove parts in the length direction, and L' is a length of the capacitor body in the length direction.

10. The multilayer capacitor of claim 8, wherein the capacitor body satisfies the relationship $\frac{1}{6}L'<d<\frac{1}{2}L'$, in which d is a width of a margin portion by which the first and second groove parts are spaced apart in the length direction, and L' is a length of the capacitor body in the length direction.

11. A board having a multilayer capacitor, the board comprising:
a circuit board having an upper surface with first and second electrode pads; and
the multilayer capacitor of claim 1, mounted on the circuit board.

12. A board having a multilayer capacitor, the board comprising:
a circuit board having an upper surface with first and second electrode pads; and
the multilayer capacitor of claim 8, mounted on the circuit board.

13. A multilayer capacitor comprising:
a capacitor body with first and second groove parts at a mounting surface of the capacitor body and spaced apart in a length direction of the capacitor body; and
first and second external electrodes in the first and second groove parts, wherein
a length of each of the first and second groove parts in the length direction is between ⅙ and ⅓ of the length of the capacitor body in the length direction,
a length by which the first and second groove parts are spaced apart in the length direction is between ⅙ and ½ of the length of the capacitor body in the length direction, and
a depth of each of the first and second groove parts in a thickness direction from the mounting surface to the opposing surface of the capacitor body is less than ⅙ of the thickness of the capacitor body in the thickness direction.

14. The multilayer capacitor of claim 13, wherein the first and second groove parts each extend away from each other to the opposing end surfaces of the ceramic body in the length direction.

15. The multilayer capacitor of claim 13, wherein the cross-sectional shape of each of the first and second groove parts is approximately semi-circular.

16. The multilayer capacitor of claim 13, wherein the cross-sectional shape of each of the first and second groove parts is approximately quadrangular.

17. A method of manufacturing a multilayer capacitor, comprising:
forming first and second dielectric layers with first and second internal electrode layers thereon, respectively, each of the first and second internal electrode layers including a lead portion extending to or toward a side of the dielectric layer;
forming a ceramic body by alternately stacking the first and second dielectric layers and oriented such that the lead portions extend in a same direction to or toward a mounting surface of the ceramic body;
forming first and second groove parts at the mounting and spaced apart in a length direction of the ceramic body, such that the lead portions of the first and second internal electrodes are exposed at the mounting surface in the first and second groove parts, respectively; and
forming first and second external electrodes in the first and second groove parts to electrically connect to the first and second internal electrodes, respectively.

18. The method of claim 17, wherein
a length of each of the first and second groove parts in the length direction is between ⅙ and ⅓ of the length of the capacitor body in the length direction,
a length by which the first and second groove parts are spaced apart in the length direction is between ⅙ and ½ of the length of the capacitor body in the length direction, and
a depth of each of the first and second groove parts in a thickness direction from the mounting surface to the opposing surface of the capacitor body is less than ⅙ of the thickness of the capacitor body in the thickness direction.

19. The method of claim 17, wherein the first and second groove parts each extend away from each other to the opposing end surfaces of the ceramic body in the length direction.

20. The multilayer capacitor of claim 1, wherein the first and second external electrodes fill in the first and second groove parts, respectively, such that the mounting surface and the first and second external electrodes form a substantially flat surface.

21. The multilayer capacitor of claim 1, wherein the first and second external electrodes do not extend out of the first and second groove parts, respectively.

22. The multilayer capacitor of claim 8, wherein the first and second external electrodes fill in the first and second groove parts, respectively, such that the mounting surface and the first and second external electrodes form a substantially flat surface.

23. The multilayer capacitor of claim 8, wherein the first and second external electrodes do not extend out of the first and second groove parts, respectively.

24. The method of claim 17, wherein the first and second external electrodes fill in the first and second groove parts, respectively, such that the mounting surface and the first and second external electrodes form a substantially flat surface.

25. The method of claim 17, wherein the first and second external electrodes do not extend out of the first and second groove parts, respectively.

\* \* \* \* \*